United States Patent
Suzuki et al.

(10) Patent No.: US 11,289,340 B2
(45) Date of Patent: Mar. 29, 2022

(54) DRY ETCHING METHOD

(71) Applicant: Central Glass Company, Limited, Ube (JP)

(72) Inventors: Shoi Suzuki, Ube (JP); Akifumi Yao, Ube (JP)

(73) Assignee: Central Glass Company, Limited, Ube (JP)

( * ) Notice: Subject to any disclaimer, the term of this patent is extended or adjusted under 35 U.S.C. 154(b) by 0 days.

(21) Appl. No.: 16/762,790

(22) PCT Filed: Oct. 24, 2018

(86) PCT No.: PCT/JP2018/039406
§ 371 (c)(1),
(2) Date: May 8, 2020

(87) PCT Pub. No.: WO2019/097964
PCT Pub. Date: May 23, 2019

(65) Prior Publication Data
US 2020/0365411 A1    Nov. 19, 2020

(30) Foreign Application Priority Data
Nov. 14, 2017    (JP) .............................. JP2017-218692

(51) Int. Cl.
*H01L 21/311* (2006.01)
*C09K 13/08* (2006.01)
*C23F 1/12* (2006.01)
*H01L 21/3065* (2006.01)

(52) U.S. Cl.
CPC ........ *H01L 21/31116* (2013.01); *C09K 13/08* (2013.01); *C23F 1/12* (2013.01); *H01L 21/3065* (2013.01)

(58) Field of Classification Search
CPC ........... H01L 21/3065; H01L 21/31116; C09K 13/08; C23F 1/12
See application file for complete search history.

(56) References Cited

U.S. PATENT DOCUMENTS 5,626,775 A    5/1997  Robert et al.
5,922,624 A    7/1999  Verhaverbeke et al.
(Continued)

FOREIGN PATENT DOCUMENTS

CN    102648171 A    8/2012
JP     8-59215 A     3/1996
(Continued)

OTHER PUBLICATIONS

International Search Report (PCT/ISA/210) issued in PCT Application No. PCT/JP2018/039406 dated Dec. 11, 2018 with English translation (five (5) pages).
(Continued)

*Primary Examiner* — Anita K Alanko
(74) *Attorney, Agent, or Firm* — Crowell & Moring LLP

(57) ABSTRACT

A dry etching method according to the present invention includes etching silicon nitride by bringing a mixed gas containing hydrogen fluoride and a fluorine-containing carboxylic acid into contact with the silicon nitride in a plasmaless process at a temperature lower than 100° C. Preferably, the amount of the fluorine-containing carboxylic acid contained is 0.01 vol % or more based on the total amount of the hydrogen fluoride and the fluorine-containing carboxylic acid. Examples of the fluorine-containing carboxylic acid are monofluoroacetic acid, difluoroacetic acid, trifluoroacetic acid, difluoropropionic acid, pentafluoropropionic acid, pentafluorobutyric acid and the like. This dry etching method enables etching of the silicon nitride at a high etching rate and shows a high selectivity ratio of the silicon nitride to silicon oxide and polycrystalline silicon while preventing damage to the silicon oxide.

7 Claims, 1 Drawing Sheet

(56) References Cited

U.S. PATENT DOCUMENTS

| | | | |
|---|---|---|---|
| 6,140,203 A * | 10/2000 | Schuegraf | H01L 21/3105 438/396 |
| 6,159,859 A | 12/2000 | Robertson, III et al. | |
| 6,221,680 B1 * | 4/2001 | Hakey | H01L 21/0273 438/8 |
| 2003/0001134 A1 | 1/2003 | Sekiya et al. | |
| 2005/0189575 A1 * | 9/2005 | Torek | H01L 21/31116 257/296 |
| 2008/0125342 A1 | 5/2008 | Visintin et al. | |
| 2008/0179292 A1 | 7/2008 | Nishimura et al. | |
| 2010/0197143 A1 | 8/2010 | Nishimura et al. | |
| 2012/0231630 A1 | 9/2012 | Takada et al. | |
| 2018/0337253 A1 | 11/2018 | Bilodeau et al. | |

FOREIGN PATENT DOCUMENTS

| | | |
|---|---|---|
| JP | 9-181054 A | 7/1997 |
| JP | 9-509531 A | 9/1997 |
| JP | 2000-58505 A | 2/2000 |
| JP | 2002-158181 A | 5/2002 |
| JP | 2008-187105 A | 8/2008 |
| JP | 2009-43973 A | 2/2009 |
| JP | 2009-129980 A | 6/2009 |
| JP | 2010-509777 A | 3/2010 |
| JP | 2010-182730 A | 8/2010 |
| JP | 2011-119310 A | 6/2011 |
| JP | 2014-197603 A | 10/2014 |
| WO | WO 2017/091572 A1 | 6/2017 |

OTHER PUBLICATIONS

Japanese-language Written Opinion (PCT/ISA/237) issued in PCT Application No. PCT/JP2018/039406 dated Dec. 11, 2018 (five (5) pages).

Taiwanese-language Office Action issued in Taiwanese Application No. 107139099 dated Apr. 29, 2018 (six (6) pages).

Taiwanese-language Office Action issued in Taiwanese Application No. 107139099 dated Oct. 9, 2018 (four (4) pages).

* cited by examiner

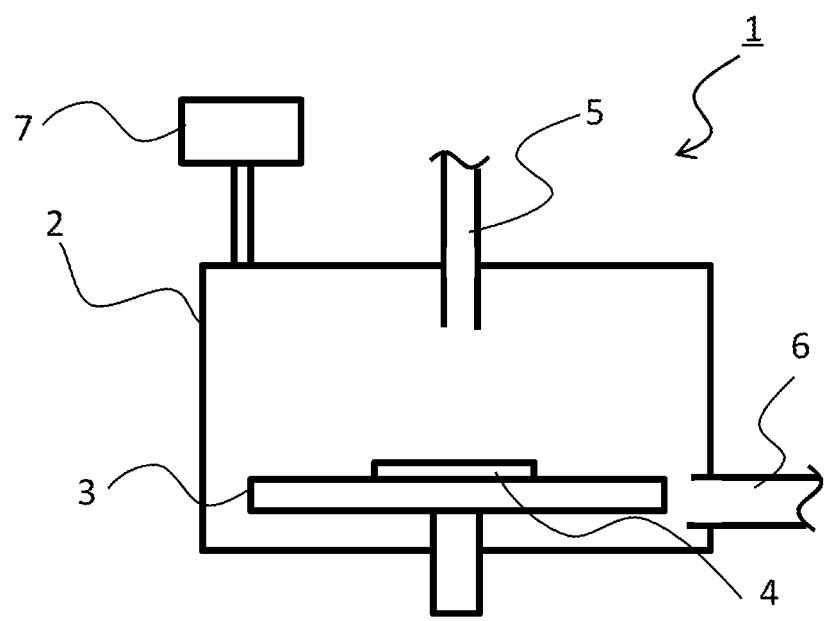

DRY ETCHING METHOD

FIELD OF THE INVENTION

The present disclosure relates to a dry etching method for etching, with a HF-containing gas, silicon nitride (SiN) as an etching target.

BACKGROUND ART

In the case of a semiconductor device having a structure in which silicon nitride (hereinafter sometimes abbreviated as "SiN") is located adjacent to silicon oxide (hereinafter sometimes abbreviated as "$SiO_2$") and/or polycrystalline silicon (hereinafter sometimes abbreviated as "p-Si") on a single crystal silicon substrate, the manufacturing of the semiconductor device includes selective etching of SiN.

Wet etching using hot phosphoric acid and dry etching using a plasma generated from a compound gas such as $CF_4$ are known as methods of etching SiN.

For example, Patent Document 1 discloses a dry etching method using an etching gas containing a gas of a compound represented by the formula: $CH_xF_{4-x}$ (where x is 2 or 3), an oxygen gas etc. for selective etching of SiN in the presence of $SiO_2$, metal silicide or silicon. It is specifically described in Patent Document 1 that the dry etching method is adapted for selectively etching a SiN film through an opening of a $SiO_2$ film while using a p-Si film under the SiN film as an etch stop layer.

In the wet etching using hot phosphoric acid and in the dry etching using a plasma, however, not only SiN but also $SiO_2$ are etched. These etching techniques thus face the problem that it is difficult to ensure the selectivity ratio of SiN to $SiO_2$.

Then, Patent Document 2 discloses a method of etching a SiN film formed on a $SiO_2$ film by feeding a HF gas in a plasma-less heating environment.

As a solution to the problem of a low etching rate of the SiN film on the $SiO_2$ film in the etching method of Patent Document 2, Patent Document 3 discloses the addition of a $F_2$ gas to the HF gas.

When the SiN film is etched with the HF gas as disclosed in Patent Document 2, the $SiO_2$ film is also etched with HF and $NH_3$ generated as a reaction product so that it is not possible to attain a high selectivity ratio $SiN/SiO_2$. When the $F_2$ gas is added as disclosed in Patent Document 3, p-Si is etched with $F_2$ and the like so that it is not possible to attain a high selectivity ratio SiN/Si.

Patent Document 4 then discloses a method of etching a SiN film with a mixed gas of HF and NO at a high selectivity ratio relative to a $SiO_2$ film and/or p-Si film. It is specifically described in this patent document that the addition of NO as an etching gas (assist gas) allows prevention of damage to the $SiO_2$ film.

PRIOR ART DOCUMENTS

Patent Documents

Patent Document 1: Japanese Laid-Open Patent Publication No. H8-59215
Patent Document 2: Japanese Laid-Open Patent Publication No. 2008-187105 (also published as Japanese Patent No. 4833878)
Patent Document 3: Japanese Laid-Open Patent Publication No. 2010-182730 (also published as Japanese Patent No. 5210191)
Patent Document 4: Japanese Laid-Open Patent Publication No. 2014-197603 (also published as Japanese Patent No. 6073172)

SUMMARY OF THE INVENTION

Problems to be Solved by the Invention

The etching method of Patent Document 4 provides an improvement in the selectivity ratio of SiN, but cannot sufficiently prevent damage to the $SiO_2$ film because of the generation of $NH_3$ as a by-product during etching of SiN. With the recent progress of fine processing, a surface roughness caused by such damage is becoming a non-negligible problem. There has been a demand for improvements to avoid this damage problem.

For prevention of damage to $SiO_2$, it is conceivable to dilute the mixed etching gas of HF and NO with the addition of an inert gas such as $N_2$, Ar or He. However, this technique presents a new problem that the originally intended etching rate of SiN becomes significantly lowered. In order to complement such a low etching rate, it is conceivable to lengthen the processing time of the etching step and thereby secure the etching amount. The time of exposure of the $SiO_2$ to the etching gas however increases with increase in processing time, which results in the development of damage to the $SiO_2$ surface. Consequently, the addition of the inert gas does not arrive at a solution to the damage problem.

In view of the foregoing, it is an object of the present disclosure to provide a dry etching method capable of etching SiN at a high etching rate and, in the case of manufacturing a semiconductor device on a silicon substrate, achieving a high selectivity ratio of SiN to $SiO_2$ or p-Si and preventing damage to $SiO_2$.

Means for Solving the Problems

As a result of extensive researches, the present inventors have found that: a fluorine-containing carboxylic acid has the capabilities of trapping $NH_3$ generated as a by-product during etching of SiN with HF, causing no etching of $SiO_2$ and p-Si, and not interfering etching of SiN with HF; and it is possible to solve the above-mentioned problems by etching SiN with a gas containing HF and the fluorine-containing carboxylic acid. The present disclosure has been accomplished based on this finding.

Accordingly, the present disclosure provides a dry etching method of etching silicon nitride, comprising: bringing a mixed gas containing hydrogen fluoride and a fluorine-containing carboxylic acid into contact with the silicon nitride in a plasma-less process at a temperature lower than 100° C.

Effects of the Invention

The present disclosure provides the effect of etching SiN at a high etching rate and, in the case of manufacturing a semiconductor device on a silicon substrate, achieving a high selectivity ratio of SiN to $SiO_2$ and p-Si and preventing damage to $SiO_2$.

BRIEF DESCRIPTION OF THE DRAWINGS

FIG. 1 is a schematic view of a reaction device used in Examples and Comparative Examples.

DETAILED DESCRIPTION OF THE EMBODIMENTS

Hereinafter, the present disclosure will be described in detail below. It should be understood that: the following description of features of the present disclosure is merely embodiments of the present disclosure and is not intended to limit the present disclosure to these embodiments; and various changes and modifications can be made to the embodiments within the sprit and scope of the present disclosure.

A dry etching method according to the present disclosure is for etching silicon nitride by using a mixed gas containing hydrogen fluoride and a fluorine-containing carboxylic acid as a dry etching gas composition and bringing this dry etching gas composition into contact with the silicon nitride in a plasma-less process at a temperature lower than 100° C.

The content amount of the fluorine-containing carboxylic acid in the mixed gas is preferably 0.01 vol % or more based on the total amount of the hydrogen fluoride and the fluorine-containing carboxylic acid.

The upper limit of the content amount of the fluorine-containing carboxylic acid is naturally determined depending on the vapor pressures of the respective compounds and the process pressure. When the process pressure is lower than the vapor pressure of the fluorine-containing carboxylic acid, the concentration of the HF decreases as the content amount of the fluorine-containing carboxylic acid becomes large. This leads to an insufficiency of the HF, which makes it impossible to ensure the sufficient etching rate of SiN. It is thus preferable to control the maximum content amount of the fluorine-containing carboxylic acid such that the concentration ratio of the HF to the fluorine-containing carboxylic acid (HF/fluorine-containing carboxylic acid) is 1 or higher.

The content amount of the fluorine-containing carboxylic acid in the mixed gas is more preferably 0.01 vol % to 50 vol %, still more preferably 0.1 vol % to 30 vol %, yet more preferably 3 vol % to 15 vol %, based on the total amount of the hydrogen fluoride and the fluorine-containing carboxylic acid.

Examples of the fluorine-containing carboxylic acid usable in the dry etching method according to the present disclosure are monofluoroacetic acid ($CH_2FCOOH$), difluoroacetic acid ($CHF_2COOH$), trifluoroacetic acid ($CF_3COOH$), difluoropropionic acid ($CH_3CF_2COOH$), pentafluoropropionic acid ($C_2F_5COOH$), heptafluorobutyric acid ($C_3F_7COOH$) and the like. These carboxylic acid gases are preferred because each can be supplied as a gas that exhibits an acid dissociation constant pKa lower than or equal to 3.2, which is an acid dissociation constant of the HF, so as to allow preferential trapping of $NH_3$, has a certain vapor pressure in the temperature range of 20 to 100° C. and does not get decomposed in this temperature range. It is feasible to vaporize the fluorine-containing carboxylic acid by heating, depressurization, bubbling etc. and supply the fluorine-containing carboxylic acid in vaporized form.

Although the fluorine-containing carboxylic acid is not necessarily an anhydride, the content of water in the fluorine-containing carboxylic acid is preferably lower than 1 mass %. It is because, when the water content of the fluorine-containing carboxylic acid is high, the fluorine-containing carboxylic acid generates $H_2O$ by vaporization thereof so that there may occur etching of $SiO_2$ by combination of the HF and $H_2O$.

The mixed gas may contain, as a dilute gas, an inert gas that does not react with the HF or fluorine-containing carboxylic acid. It is feasible to adjust the etching rate of the SiN according to the content amount of the inert gas in the mixed gas. Examples of the inert gas are $N_2$, He, Ne, Ar, Kr and the like. The content amount of the inert gas in the mixed gas is generally in the range of 0 vol % to 90 vol %.

The process temperature at which the silicon nitride and the dry etching gas composition are brought into contact with each other is preferably higher than or equal to 20° C. and lower than 100° C., more preferably higher than or equal to 40° C. and lower than or equal to 80° C., still more preferably higher than or equal to 50° C. and lower than or equal to 75° C.

The process pressure is preferably in the range of 0.1 kPa to 101.3 kPa, more preferably 1 kPa to 50 kPa.

The silicon nitride as the etching target of the present disclosure refers to a compound represented by $SiN_x$ (where x is greater than 0 and smaller than or equal to 2) such as $Si_3N_4$.

It is preferable that, in the case where the dry etching gas composition according to the present disclosure is brought into contact with silicon nitride, silicon oxide and polycrystalline silicon, the SiN-to-$SiO_2$ etching selectivity ratio (SiN/$SiO_2$) and the SiN-to-p-Si etching selectivity ratio (SiN/Si) are each 100 or higher. Further, it is preferable that the etching rate of SiN is at a high level of 100 nm/min or higher.

The dry etching method according to the present disclosure enables high-rate, high-selectivity etching of the SiN without causing damage to the $SiO_2$ and p-Si. Moreover, the dry etching method according to the present disclosure can be implemented in a plasma-less process at a low temperature of lower 100° C.

When $NH_3$ is generated as a by-product during the etching of the SiN, there occurs a side reaction in which the $NH_3$ reacts with the HF to form $NH_4F$. This leads to a decrease in the concentration of the HF at the SiN surface and thus becomes a cause of lowering the etching rate of the SiN. In the dry etching method according to the present disclosure, however, it is expected that the occurrence of the above side reaction is prevented by the addition of the fluorine-containing carboxylic acid whereby the lowering of the etching rate is suppressed.

In the case where a trace amount of water is contained in the HF or in the case where absorbed water is present on the $SiO_2$ surface, the etching of the $SiO_2$ may proceed by the combined action of the trace water and HF. In the dry etching method according to the present disclosure, it is expected that the trace water is removed by the addition of the fluorine-containing carboxylic acid whereby the etching of the $SiO_2$ is further prevented.

In the case of manufacturing a semiconductor device on a silicon substrate, the dry etching method according to the present disclosure is applicable to the selective etching of SiN from the structure in which SiN is adjacent to $SiO_2$ and/or p-Si or in which $SiO_2$ and/or p-Si and SiN are exposed. Examples of such a structure are those in which a $SiO_2$ and/or p-Si film is covered by a SiN film and in which a $SiO_2$ film, a SiN film and a p-Si film are laminated to one another. For example, the dry etching method according to the present disclosure can be applied to the manufacturing of a three-dimensional memory by forming a through hole in a laminated film of $SiO_2$ and SiN, supplying the etching gas composition through the through hole and thereby, while leaving the $SiO_2$, selectively etching the SiN such that the three-dimensional memory has a configuration in which a plurality of $SiO_2$ layers are arranged in parallel to each other with a clearance held therebetween.

EXAMPLES

The present disclosure will be described in more detail below by way of the following examples and comparative examples. It should be understood that the present disclosure is not limited to the following examples.

FIG. 1 is a schematic view of a reaction device 1 used in each of the examples and comparative examples. In the reaction device, a stage 3 with a heater function was arranged in a chamber 2. A heater was also disposed around the chamber 2 so as to heat a wall of the chamber. A gas supply unit was arranged to supply a dry etching gas composition into the chamber 2 although not specifically shown in the drawing. A gas introduction hole 5 was provided on an upper part of the chamber 2 such that the dry etching gas composition was introduced into the chamber through the gas introduction hole 5 and brought into contact with a sample 4 placed on the stage 3. The gas inside the chamber 2 was discharged through a gas discharge line 6. Although not specifically shown in the drawing, a vacuum exhaust pump (as a vacuum exhaust unit) is connected to the gas discharge line so as to depressurize the inside of the chamber 2. Further, a pressure gauge 7 is disposed on the chamber 7.

Example 1

As the sample 4, a silicon wafer A with a p-Si film, a silicon wafer B with a $SiO_2$ film and a silicon wafer C with a SiN film were placed on the stage 3. Herein, each of the SiN film and the p-Si film was formed by a CVD method; and the $SiO_2$ film was formed by performing thermal oxidation treatment on a surface of the silicon wafer. The temperature of the stage 3 was set to 70° C. A mixed gas of HF and $CF_3COOH$ (as prepared by mixing 99.9 vol % of HF with 0.1 vol % of $CF_3COOH$) was fed in a total amount of 1000 sccm to the sample. The pressure inside the chamber 2 was set to 10 kPa. The sample was then subjected to etching.

After the etching, the etching rate was respectively determined from changes in thicknesses of the p-Si film of the silicon wafer A, the $SiO_2$ film of the silicon wafer B and the SiN film of the silicon wafer C before and after the etching. The SiN-to-p-Si etching rate ratio SiN/p-Si and the SiN-to-$SiO_2$ etching rate ratio SiN/$SiO_2$ were also determined.

Furthermore, the surface roughness Ra of the $SiO_2$ film was evaluated by measurement with an atomic force microscope (AFM). The term "surface roughness Ra" as used herein refers to an athematic average roughness according to JIS B 0601:1994.

Examples 2 to 5 and Comparative Examples 1 to 3

The etching test and evaluation were carried out in the same manner as in Example 1, except that the kind and concentration of the additive gas were changed.

The etching conditions and evaluation results of Examples 1 to 5 and Comparative Examples 1 to 3 are shown in TABLE 1.

TABLE 1

| | Process pressure | Process temp. | Kind of additive gas | Conc. [vol %] of additive gas | Conc. [vol %] of HF | SiN-etching rate [nm/min] | SiN/p-Si | SiN/$SiO_2$ | Surface roughness Ra [µm] of $SiO_2$ film |
|---|---|---|---|---|---|---|---|---|---|
| Example 1 | 10 kPa | 70° C. | $CF_3COOH$ | 0.1 | 99.9 | 839 | >1000 | 156 | <1 |
| Example 2 | 10 kPa | 70° C. | $CF_3COOH$ | 1 | 99 | 794 | >1000 | 181 | <1 |
| Example 3 | 10 kPa | 70° C. | $CF_3COOH$ | 5 | 95 | 729 | >1000 | 281 | <1 |
| Example 4 | 10 kPa | 70° C. | $CF_3COOH$ | 10 | 90 | 554 | >1000 | 241 | <1 |
| Example 5 | 10 kPa | 70° C. | $C_2F_5COOH$ | 5 | 95 | 712 | >1000 | 264 | <1 |
| Comparative Example 1 | 10 kPa | 70° C. | none | 0 | 100 | 845 | >1000 | 82 | 2.2 |
| Comparative Example 2 | 10 kPa | 70° C. | $F_2$ | 1 | 99 | 1004 | 2 | 1674 | <1 |
| Comparative Example 3 | 10 kPa | 70° C. | NO | 10 | 90 | 699 | >1000 | 233 | 3.6 |

In Examples 1 to 5, the SiN film was selectively etched as compared to the p-Si and $SiO_2$ films. Since there was almost no damage to the surface of the $SiO_2$ film, the surface of the $SiO_2$ film was smaller than 1 µm in roughness Ra and was very smooth.

On the other hand, in Comparative Example 1 where the etching was done only with the HF gas as in Patent Document 2, not only the SiN film but also the $SiO_2$ film were etched so that the etching rate ratio SiN/$SiO_2$ was low. In Comparative Example 2 where the etching was done with the mixed gas of HF and $F_2$ as in Patent Document 3, the p-Si film was etched with the $F_2$ gas so that the etching rate ratio SiN/p-Si was low. In Comparative Example 3 where the etching was done with mixed gas of HF and NO as in Patent Document 4, there occurred damage to the $SiO_2$ film so that the surface of the $SiO_2$ film after the etching was rough.

DESCRIPTION OF REFERENCE NUMERALS

1: Reaction device
2: Chamber
3: Stage
4: Sample
5: Gas introduction port
6: Gas discharge line
7: Pressure gauge

The invention claimed is:

1. A dry etching method for selectively etching silicon nitride, from a structure in which the silicon nitride is adjacent to either or both of silicon oxide and polycrystalline silicon or a structure in which the silicon nitride and either or both of the silicon oxide and the polycrystalline silicon are exposed, the dry etching method comprising bringing a mixed gas containing hydrogen fluoride and a fluorine-containing carboxylic acid into contact with the silicon nitride and the either or both of the silicon oxide and the polycrystalline silicon in a plasma-less process at a temperature lower than 100° C., thereby selectively etching the silicon nitride,
wherein an etching selectivity ratio of the silicon nitride to the silicon oxide and an etching selectivity ratio of the silicon nitride to the polycrystalline silicon are each 100 or higher.

2. The dry etching method according to claim 1,
wherein the fluorine-containing carboxylic acid is contained in an amount of 0.01 vol % or more based on the total amount of the hydrogen fluoride and the fluorine-containing carboxylic acid.

3. The dry etching method according to claim 1,
wherein the fluorine-containing carboxylic acid is at least one kind selected from the group consisting of monofluoroacetic acid, difluoroacetic acid, trifluoroacetic acid, difluoropropionic acid, pentafluoropropionic acid and heptafluorobutyric acid.

4. The dry etching method according to claim 1,
wherein the fluorine-containing carboxylic acid is trifluoroacetic acid or pentafluoropropionic acid, and
wherein the fluorine-containing carboxylic acid is contained in an amount of 0.1 vol % to 30 vol % based on the total amount of the hydrogen fluoride and the fluorine-containing carboxylic acid.

5. The dry etching method according to claim 2,
wherein the fluorine-containing carboxylic acid is contained in an amount of 0.1 vol % to 30 vol % based on the total amount of the hydrogen fluoride and the fluorine-containing carboxylic acid.

6. The dry etching method according to claim 1,
wherein the etching of the silicon nitride is performed at an etching rate of 100 nm/min or higher.

7. A dry etching method for selectively etching, from a structure in which silicon nitride is adjacent to either or both of silicon oxide and polycrystalline silicon or a structure in which silicon nitride and either or both of silicon oxide and polycrystalline silicon are exposed, the silicon nitride,
the dry etching method comprising bringing a mixed gas containing hydrogen fluoride and a fluorine-containing carboxylic acid into contact with the silicon nitride and the either or both of the silicon oxide and the polycrystalline silicon in a plasma-less process at a temperature lower than 100° C., thereby selectively etching the silicon nitride,
wherein the fluorine-containing carboxylic acid is at least one kind selected from the group consisting of monofluoroacetic acid, difluoroacetic acid, trifluoroacetic acid, difluoropropionic acid, pentafluoropropionic acid and heptafluorobutyric acid, and is contained in an amount of 0.01 vol % or more based on the total amount of the hydrogen fluoride and the fluorine-containing carboxylic acid, and
wherein an etching selectivity ratio of the silicon nitride to the silicon oxide and an etching selectivity ratio of the silicon nitride to the polycrystalline silicon are each 100 or higher.

\* \* \* \* \*